(12) United States Patent
Hurst et al.

(10) Patent No.: US 6,547,587 B2
(45) Date of Patent: Apr. 15, 2003

(54) CONNECTION INTERFACE SYSTEM

(75) Inventors: Roy J. Hurst, Chesire (GB); Stuart Mellor, Cheshire (GB); Barry V Edwards, Cheshire (GB)

(73) Assignee: MAC Panel Company, Highpoint, NC (US)

( * ) Notice: Subject to any disclaimer, the term of this patent is extended or adjusted under 35 U.S.C. 154(b) by 0 days.

(21) Appl. No.: 09/985,381

(22) Filed: Nov. 2, 2001

(65) Prior Publication Data

US 2002/0137389 A1 Sep. 26, 2002

(30) Foreign Application Priority Data

Mar. 26, 2001 (GB) .............................................. 010760

(51) Int. Cl.$^7$ .............................................. H01R 13/60
(52) U.S. Cl. ........................ 439/532; 439/716; 361/798; 361/801; 361/802
(58) Field of Search ................................ 439/532, 716, 439/715, 717, 94; 211/41.17; 361/725, 726, 727, 798, 801, 802, 825

(56) References Cited

U.S. PATENT DOCUMENTS

| | | | |
|---|---|---|---|
| 3,191,097 A | 6/1965 | Dano et al. .................. 361/726 |
| 4,073,563 A | * 2/1978 | Bailey et al. ................ 439/532 |
| 4,329,005 A | 5/1982 | Braginetz et al. ............. 439/51 |
| 4,434,537 A | 3/1984 | Bean et al. .................... 24/380 |
| 4,498,119 A | 2/1985 | Cronin ......................... 361/386 |
| 4,523,254 A | 6/1985 | Konshak ...................... 361/391 |
| 4,602,829 A | 7/1986 | De Andrea .................. 312/320 |
| 4,672,511 A | 6/1987 | Meusel et al. ............... 361/415 |
| 4,716,495 A | 12/1987 | Craker ......................... 361/391 |
| 4,758,928 A | 7/1988 | Wierec et al. ............... 361/415 |
| 4,778,401 A | 10/1988 | Boudreau et al. ........... 439/153 |
| 4,797,610 A | 1/1989 | Fombellida .................. 324/158 |
| 4,800,463 A | 1/1989 | Ferchau et al. .............. 361/383 |
| 4,829,402 A | 5/1989 | Gewebler et al. ........... 361/424 |
| 4,836,789 A | 6/1989 | Rudy, Jr. et al. .............. 439/64 |
| 5,103,378 A | * 4/1992 | Stowers et al. .............. 361/415 |

* cited by examiner

Primary Examiner—Renee Luebke
Assistant Examiner—Ross Gushi
(74) Attorney, Agent, or Firm—Pillsbury Winthrop LLP

(57) ABSTRACT

A connection interface system for providing an interface between a unit under test and testing equipment includes a receiver having an upper mounting bar associated with an upper mounting rail to define an upper channel and a lower mounting bar associated with a lower mounting rail to define a lower channel, and at least one receiver connector module releasably mounted on the top panel frame. The receiver connector module includes an upper shoulder mounted within the upper channel, a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel.

20 Claims, 8 Drawing Sheets

CONNECTION INTERFACE SYSTEM

FIELD OF THE INVENTION

The present invention relates to a connection interface system for providing an interface between a unit under test (UUT) and testing equipment to facilitate automatic testing of the UUT by the testing equipment.

BACKGROUND OF THE INVENTION

A connector interface system comprises two main parts, namely, a receiver and an interchangeable test adapter (ITA). The receiver and the ITA are each adapted to carry a plurality of connector modules. The connector modules provide holders into which contacts and cables of electrical wiring can be received, in the case of the receiver the contacts of the wiring which connects to the testing equipment and in the case of the ITA the contacts of the wiring which connects to the UUT. Mating of the contacts of the connector modules of the receiver and those of the ITA, connects the testing equipment to the UUT. In order to facilitate this mating the ITA has rollers which locate into latches on the receiver. A mechanical leverage system, housed within the receiver, connects these latches to a handle. When the handle is operated, this causes the ITA, guided by the location device, to be drawn accurately into the receiver, making the electrical contacts and then drawing it into place. Operating the handle in the opposite direction will break the electrical contacts and release the ITA ready for removal or re-engagement. This system of mating is described in Intellitest (Europe) Limited's UK Patent Application, published under the number GB 2 323 219.

In order to allow maximum flexibility in the lay out of electrical contacts, and thereby allow connection to a variety of testing equipment and UUT, a modular mounting system is generally employed for both the receiver and the ITA. By changing the type of connector modules attached to the frameworks of the receiver and the ITA, modules can be provided which allow a required style of connection for the UUT and the testing equipment. Therefore, the receiver and the ITA are generally adapted to receive a plurality of different connector modules, at a plurality of positions on their framework.

In a known interface system there is provided a receiver comprising a substantially rectangular frame which can be directly mounted to the housing of testing equipment, the housing providing a card case comprising a plurality of test cards mounted in rails therein. The frame work of the receiver has a pair of spaced apart, parallel mounting bars each of which has a plurality of screw receiving apertures. The receiver connector modules can be mounted between these bars by securing the module with screws to the bars. During the mating of the contacts held by the receiver connector modules and those held by the ITA connector modules, each contact experiences several grams of mating force. For the considerable number of contacts being made or broken during mating and breaking of the contacts, this can amount to in the order of half a ton of mating or breaking force at the interface.

The advantage of this known receiver is, that because the receiver connector modules are firmly secured to the receiver frame by screw fittings, some of this force is absorbed by the receiver thereby reducing the occurrence of potential damage to the contacts. However, the disadvantage is that when breaking the contacts the force absorbed by the receiver connector, module affixing is concentrated on the screw fitting, leading to potential damage of this fitting and thereby reduction in the life span of the receiver.

The receiver connector modules are removably affixed to the front of the receiver in order that when the receiver is affixed to the testing equipment, the module can be simply unscrewed and removed to allow access into the testing equipment. For this purpose it is necessary that the wiring leading from the receiver connector modules to the test cards, which are held within the testing equipment, is relatively long in order to allow the module to be lifted away without damaging the contacts at either the module or at the card. This has the disadvantage that, due to the large number of contacts a considerable mass of unruly wiring is present, which makes it difficult for an operator to access and therefore reconfigure the system.

In order to alleviate the above described drawback a receiver was developed by Virginia Panel Corporation (U.S. Pat. No. 5,103,378) in which instead of mounting the receiver connector modules on the front of the receiver, these modules are instead located at the rear of the receiver. In this design each module is mounted on an adapter. The adapter provides an extension into the testing unit and the wires of the contacts held in the module are contained within the housing of the adapter. The end of the adapter, remote from the module, carries a further interface for connection to the test cards held within the testing unit. When the receiver is pivoted to a lower position, the module and associated adapter remain in the electronic equipment cabinet, i.e., they do not pivot with the receiver.

This arrangement has the advantage that it keeps the wiring more ordered, and the adapter carrying the module is more readily demountable. In order for the contacts held in the receiver connector module to mate with those of the ITA connector module, the receiver and adapter carry respective co-acting alignment holes and alignment pins. In this respect, a pair of affixed alignment pins are located on the adapter, one on either side of the connector module. The alignment holes on the receiver are provided as apertures in the mounting bars of the receiver. The connector module is positioned by the placement of the adapter pins into corresponding apertures in the mounting bars of the receiver, and the module is held in place by its affixing on the test card.

In order to allow removal of a connector module in order to access the testing equipment, the receiver is additionally modified to comprise a front and back panel frame sections which are permanently hinged together to allow the front panel to be pivoted away from the back panel, which back panel in use would be secured to the testing equipment. The front panel carries the latches to connect the ITA to the receiver and also the mounting bars. Because the pins of the receiver connector module are only located in and not held by the apertures on the mounting bars, when the front panel is hinged down, the receiver connector module is accessible to an operator who then simply removes the receiver connector module by disconnecting its affixing to the test card. While this system allows easier access to the test cards, it has the disadvantage that when the contacts held by the receiver connector module and those of the ITA connector module are mated, the mating force on the receiver connector modules force the modules backwards into the testing equipment. Because the modules are not affixedly held in place by the receiver the mating force is transferred through the affixing of its adapter to the test card. This results in possible damage to the cards and/or their connections to the adapter and/or the contacts held in the module which may buckle when the contacts held in the modules of the ITA are inserted.

A further disadvantage of this design of receiver for the connection interface system is that it is specially designed for testing equipment incorporating rail mounted test cards which provide a connection and mounting for the adapters together with sufficient internal space to accommodate the reverse located receiver connector modules with their integral adapter. It is not suitable for bench or rack and stack mounted test equipment, because the only affixing for the receiver connector modules is to the test cards and it is not possible to mate the contacts held within the receiver/connector modules and those of the ITA without some form of affixing. Furthermore the adapters are specifically designed to only connect to the testing cards.

SUMMARY OF THE INVENTION

It is an aspect according to embodiments of the present invention to provide a connection interface system that overcomes or alleviates the above described drawbacks.

In a preferred embodiment, a connection interface system for providing an interface between a unit under test and testing equipment includes a receiver having a first frame for the testing equipment, a second frame for the unit under test, and at least one receiver connector module. The receiver includes an upper mounting bar associated with an upper mounting rail to define an upper channel and a lower mounting bar associated with a lower mounting rail to define a lower channel. The at least one receiver connector module is releasably mounted on the receiver. The receiver connector module includes an upper shoulder mounted within the upper channel, a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel.

In another preferred embodiment, a receiver for use in a connection interface system includes an upper mounting bar associated with an upper mounting rail to define an upper channel, a lower mounting bar associated with a lower mounting rail to define a lower channel, and at least one receiver connector module releasably mounted on the top panel frame. The receiver connector module includes an upper shoulder mounted within the upper channel and a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel.

In yet another preferred embodiment, a method for reverse mounting a receiver connector module to a receiver comprises inserting a lower shoulder of the receiver connector module into a lower channel on a rear portion of the receiver, sliding a lower positioning member of the receiver connector module into a slot of the lower mounting bar of the receiver, pivoting an upper shoulder of the receiver connector module towards a rear portion of an upper mounting bar of the receiver, and inserting an upper positioning member of the receiver connector module into a slot or an aperture of the upper mounting bar of the receiver.

In still another preferred embodiment, a connection interface system for providing an interface between a unit under test and testing equipment includes a front portion of the receiver, a rear portion of the receiver, a receiver, and at least one receiver connector module. The receiver being between the first frame and second frame. The receiver having a front portion and a rear portion, the receiver including an upper mounting bar associated with an upper mounting rail at the rear portion of the receiver to define an upper channel at the rear portion of the receiver and a lower mounting bar associated with a lower mounting rail at the rear portion of the receiver to define a lower channel at the rear portion of the receiver, and at least one receiver connector module releasably reverse mounted on the rear portion of the receiver. The receiver connector module includes an upper shoulder mounted within the upper channel, a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel.

In another preferred embodiment, a receiver for use in a connection interface system includes an upper mounting bar associated with an upper mounting rail at a rear portion of the receiver to define an upper channel at the rear portion of the receiver, a lower mounting bar associated with an lower mounting rail at the rear portion of the receiver to define an lower channel at the rear portion of the receiver, and at least one receiver connector module releasably mounted on the rear portion of the receiver. The receiver connector module includes an upper shoulder mounted within the upper channel, a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel.

These and other aspects and/or advantages of the preferred embodiments will be described in or apparent from the following description.

BRIEF DESCRIPTION OF THE DRAWINGS

By way of example only, embodiments of the present invention will now be described, with reference to the accompanying drawings, in which.

DETAILED DESCRIPTION OF PREFERRED EMBODIMENTS

Figure 1:
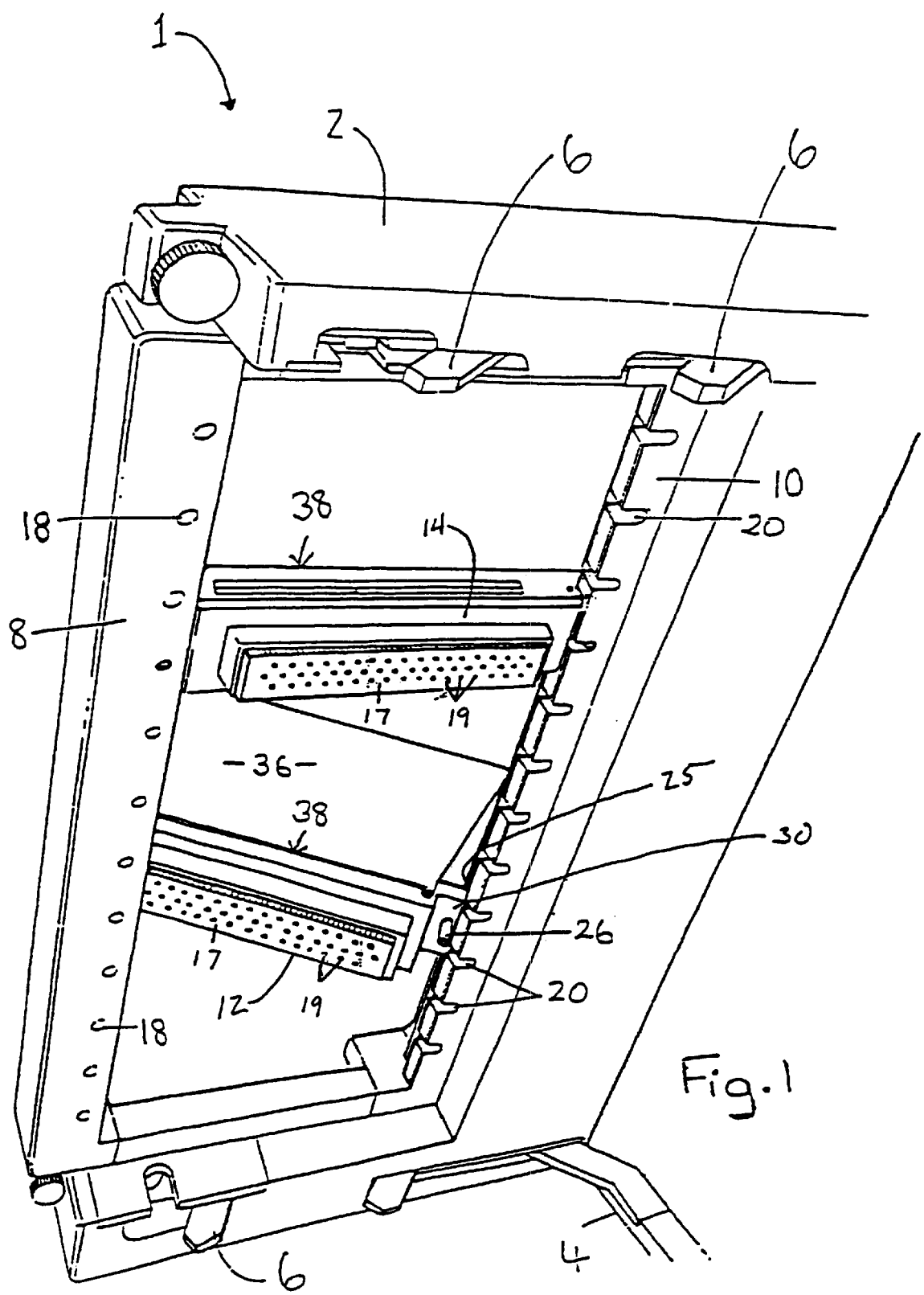
FIG. 1 is a front perspective view of a receiver and connector modules constructed in accordance with a first embodiment of the invention, the back panel of which has been omitted for the sake of clarity.
Figure 2:
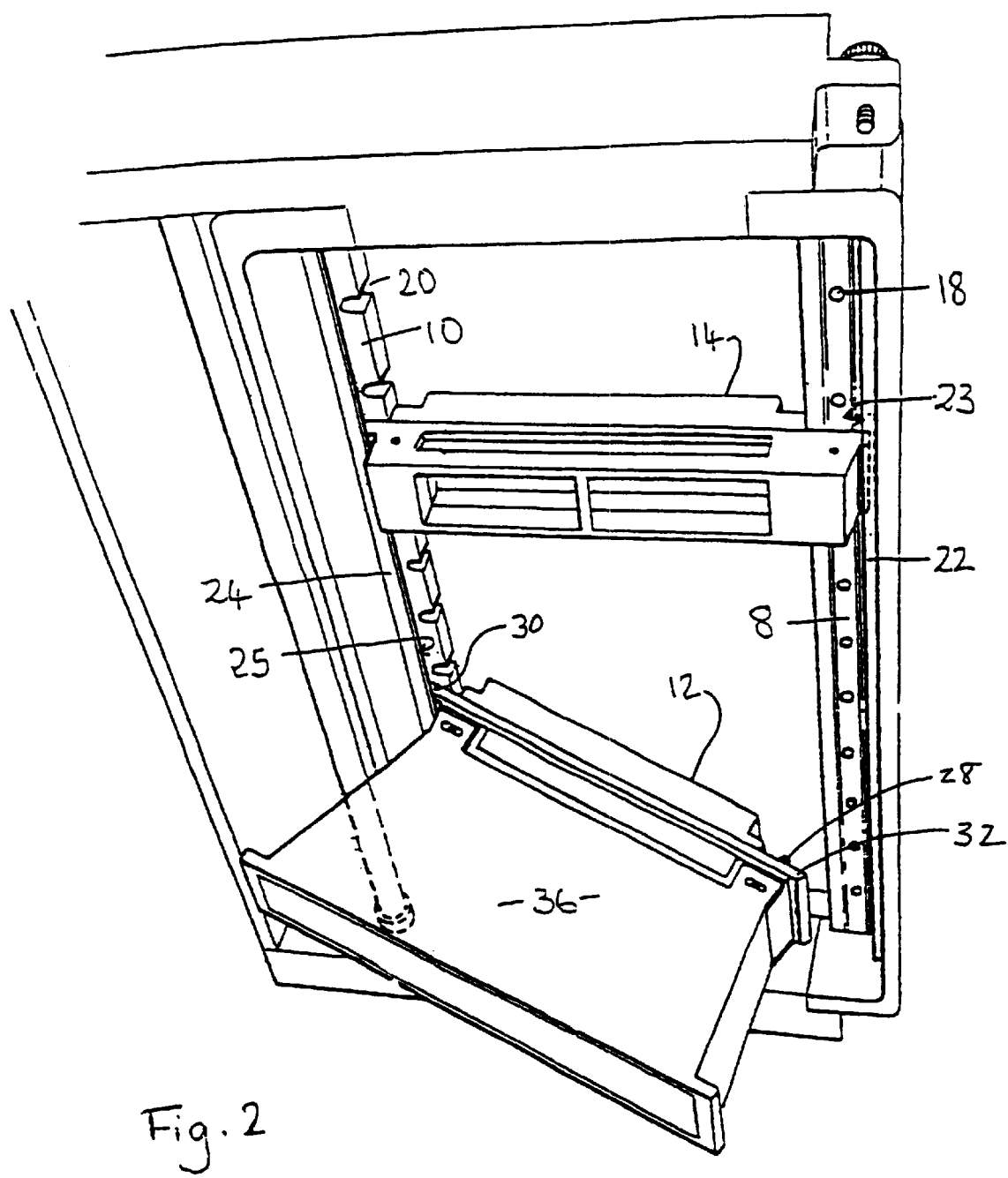
FIG. 2 is a rear perspective view of the receiver of FIG. 1.

Referring to FIGS. 1 and 2, a first embodiment of the invention includes a receiver 1 having a substantially rectangular top panel frame 2 which incorporates a handle 4 and an operated latch mechanism 6 to receive an ITA (not illustrated). The frame 2 has a pair of mounting bars, including an upper mounting bar 8 and a lower mounting bar 10, between which receiver connector modules 12, 14 and 16 (see FIG. 3) may be mounted. The upper mounting bar 8 has a series of through apertures 18 and the lower mounting bar 10 has a series of corresponding through slots 20 aligned with the through apertures 18. As best illustrated in FIG. 2, the rear of the top panel frame 2 (the rear being the side which faces the bottom panel frame in use and which the bottom panel frame has been omitted from the figure for the sake of clarity) carries two rails, including an upper mounting rail 22 and a lower mounting rail 24 which together with the mounting bars 8 and 10 form channels, including an upper channel 23 and a lower channel 25, the operation of which will be described further hereunder.

Figure 3:
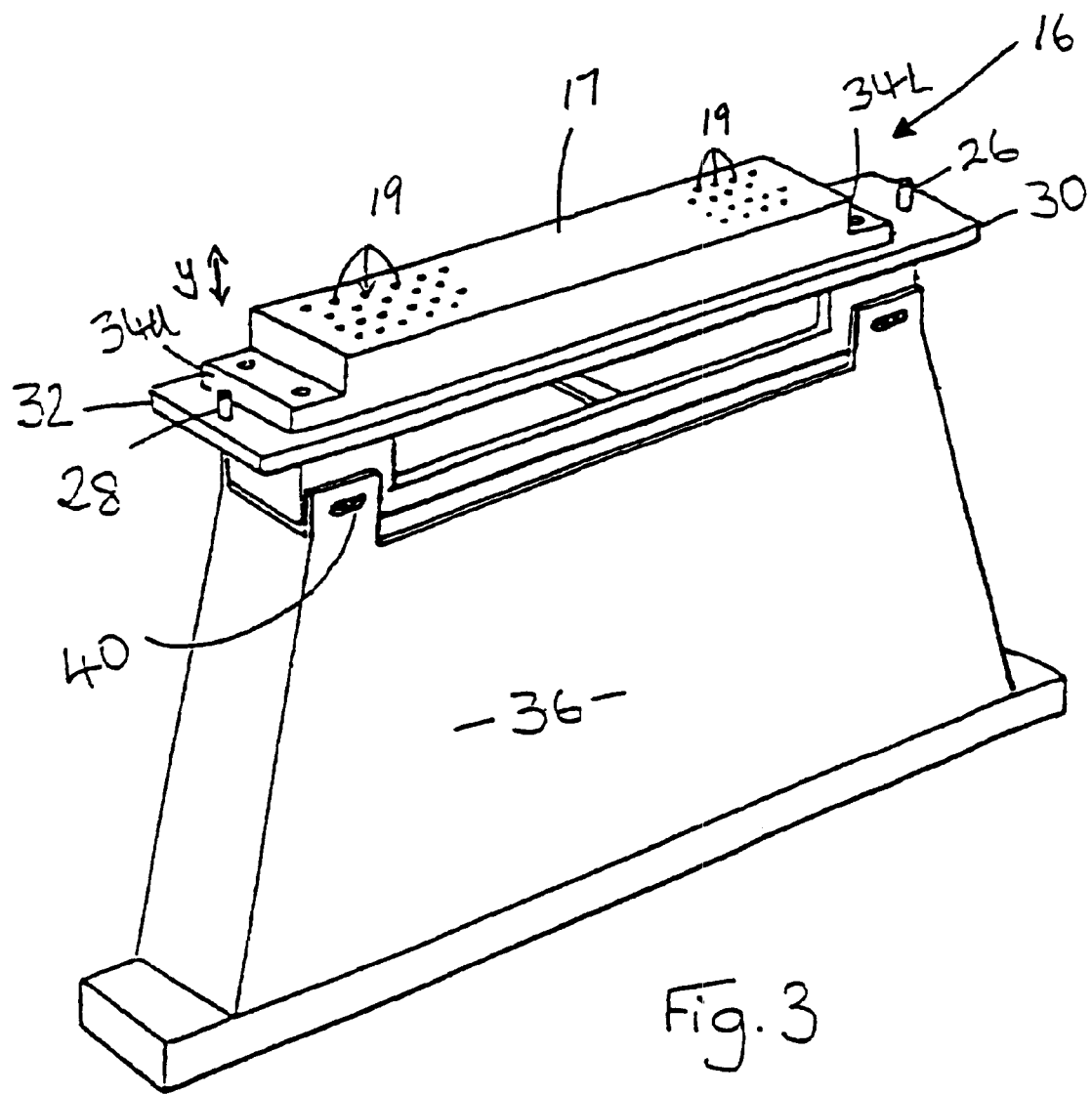
FIG. 3 is a perspective view of a receiver connector module according to another embodiment of the invention.

As best illustrated in FIG. 3, each of the receiver connector modules 12, 14 and 16 carries a positioning member, e.g., upper and lower alignment pins 26 and 28. The positioning members 26, 28 are provided on opposite longitudinal sides of the section of the module 16 carrying a mating interface 17 with through bores 19 for receipt of contacts of wiring. Pin 26 is preferably a fixed member, while pin 28 is preferably spring loaded to allow a forced movement along a longitudinal axis Y, which is more fully described below. Each connector module 12, 14 and 16 also carries two shoulders, e.g., upper and lower shoulders 32 and 30. Lower shoulder 30 protrudes further beyond the edge 34L of the mating interface 17 than the upper shoulder 32 protrudes from an opposite edge 34L of the mating interface. Each mating interface 17 may be connected to the plate forming the shoulders 30, 32 of appropriate fastening means, e.g., glue, screws, etc.

As best illustrated in FIGS. 1 and 2 with respect to module 12, the lower shoulder 30 is reverse mounted at the receiver 1 into lower channel 25 formed between lower mounting rail 24 and the rear of the lower mounting bar 10. The lower shoulder 30 is inserted deeply, down into the lower channel 25 and its pin 26 into slot 20. The opposite end of the module 12 is rotated, moved or pivoted towards the upper mounting bar 8. When the upper shoulder 32 contacts the rear side of the upper mounting bar 8, the pin 28 is forced to retract into the upper shoulder 32. The module 12 is then moved upwards such that the lower shoulder 30 moves upwards within the lower channel 25 and so that the upper shoulder 32 engages in the upper channel 23, as best illustrated with respect to the module 14 in FIG. 2. The upper channel 23 is formed between the upper mounting rail 22 and the rear of the upper mounting bar 8. As the module is moved up, the pin 28 enters the through aperture 18, which is no longer compressed by the upper mounting bar 8. Entry of the pin 28 into the through aperture 18 affixes the relative position of the module 14 on the receiver 1. The module 12, 14, 16 is retained on the receiver 1 by the rails 22, 24 contacting the rear of shoulders 30, 32 and the mounting bars 8, 10 contacting the front of shoulders 30, 32. Assuming it is not retractable, which is not the preferred embodiment, the pin can simply slide along the rail until it aligns with the aperture 18.

The top panel frame 2 releasably retains the receiver contact modules 12, 14, 16 so that the mating force when mating or breaking the contacts held by the receiver contact modules 12, 14, 16, and those of the ITA, are absorbed by the channels and mounting on the receiver, and not transferred to the mounting of an optional adapter 36 as per the system whereby the modules 12, 14, 16 are merely reversed mounted with respect to the receiver 1. The optional adapter 36 may be provided for connection to test cards of a card cage, to thereby reduce the amount of loose wiring present. Also, because the modules are releasably retained on the receiver 1, it is possible to also mount modules 12, 14, 16, which do not incorporate the adapter 36, making the present system suitable not only for mounting to a card cage, but also for bench and rack and stack type testing equipment.

FIGS. 1 to 3 illustrate three variants of the receiver connector module. Each of these modules comprise the same bottom frame configured to affix to the testing equipment for affixing the module 12, 14, 16 to the receiver 1 as described above. Modules 12 and 16 are each adapted to be connected to the optional adapter 36. Module 12 is formed as a unitary unit, while module 16 is provided with an anodized aluminum supporting structure on which the pins 26 and 28 are formed. Assuming the adapter 36 is used, the modules 12 and 16 can be mounted on the adapter 36 via a mounting 40. The mounting 40 facilitates a small amount of predetermined play or relative motion between the connector module 12, 16 and the adapter 36. This allows a slight repositioning of the connector module 12, 16, when its contacts are mated with those of the ITA connector modules and reduce potential bending of the card, to which the back of the adapter 36 is attached, by correction of any slight misalignment between the contacts held in the receiver and the ITA. This also reduces damage to the contacts. A small amount of play is also present in the slot and apertures of the mounting bars to facilitate this slight play during mating.

The module 14 is not connected to an adapter and although it may comprise the anodized aluminum reinforcement as illustrated in the embodiment of FIG. 3, the module 12 which is formed as a unitary piece could also be provided without the adapter 36, such that the pins 26, 28 are directly accessible from its rear 38 to allow the insertion of contacts. In this respect modules 12 (minus the adapter 36) and 14 are particularly suited for use with bench or rack and stack style testing equipment.

In order to remove modules 12, 14 or 16 from the receiver, a blunt pointer is inserted into through aperture 18 on upper mounting bar 8 in order to depress pin 28. The module 12, 14 or 16 can then be moved downward so that lower shoulder 30 travels more deeply into lower channel 25, pin 28 moves behind the upper mounting bar 8 and remains depressed, while upper shoulder 32 is released from upper channel 23. The now free end of the module 12, 14, 16 can be rotated or pivoted away from the receiver 1 and the lower shoulder 30 lifted from lower channel 25.

Figure 4:
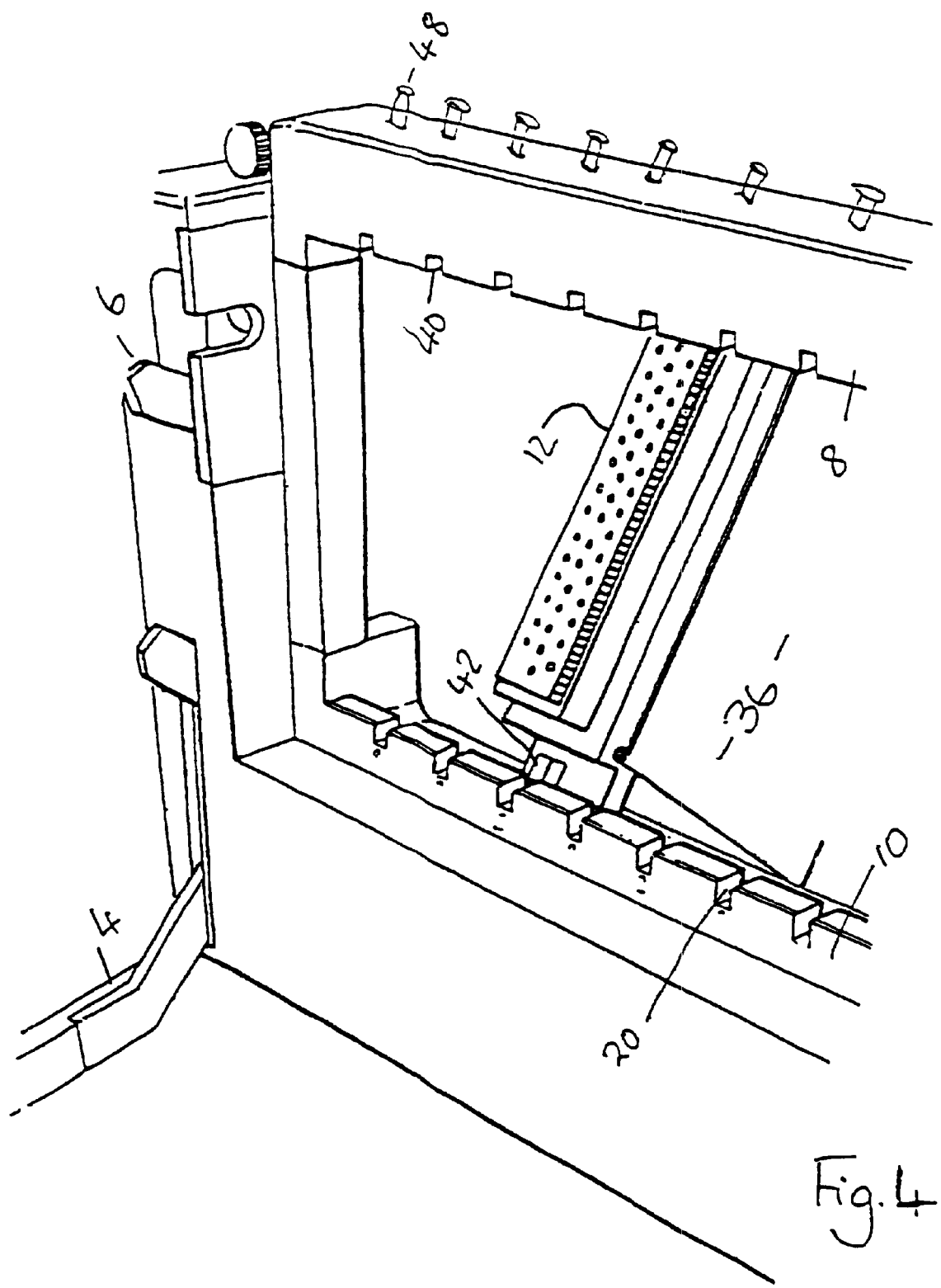
FIG. 4 is a partial front perspective illustrating a receiver and a receiver connector module according to a second embodiment of the invention.
Figure 5:
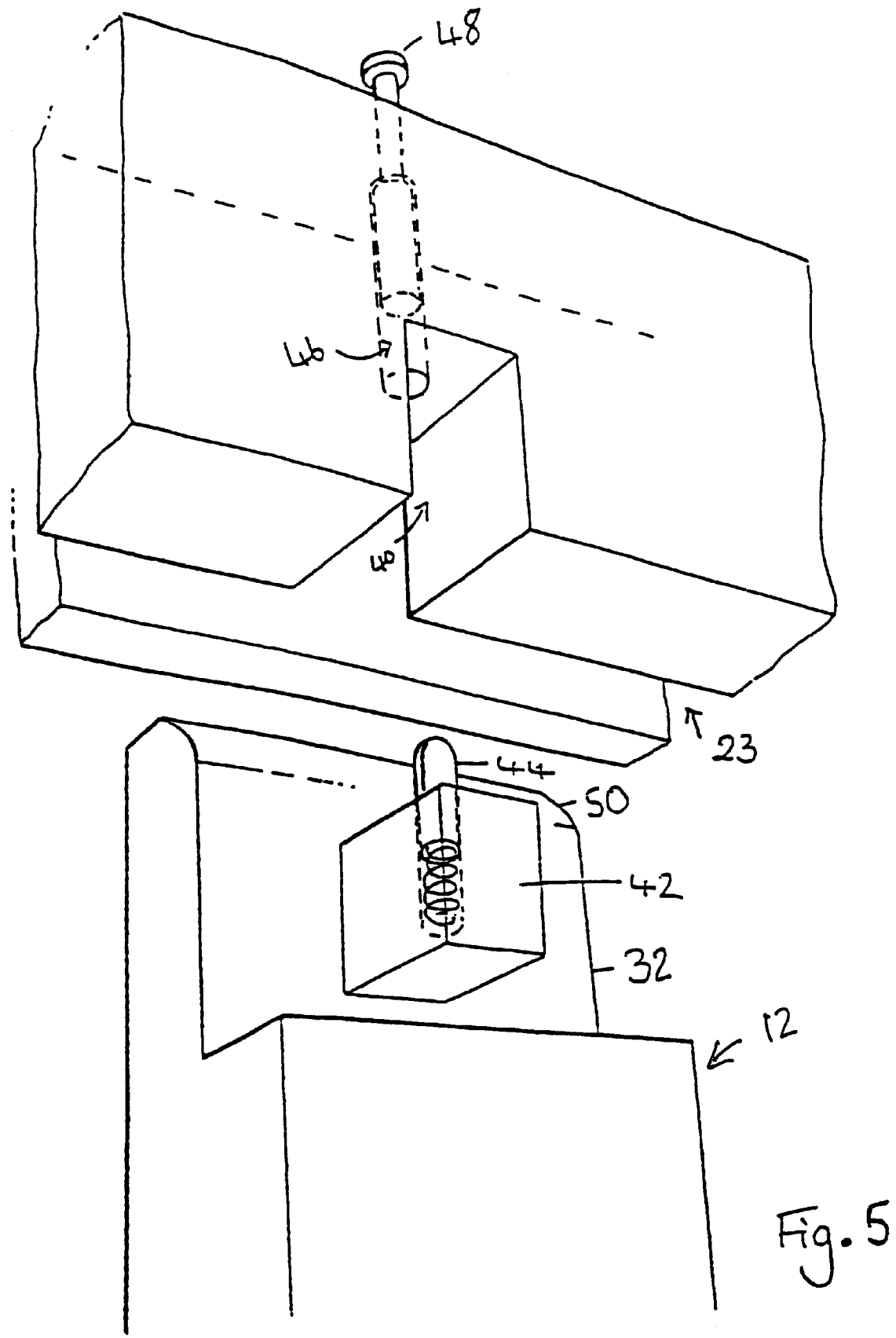
FIG. 5 is an exploded, enlarged perspective view of the receiver connector module and receiver of FIG. 4 illustrating spring-loaded affixing of the module in the receiver.

In the embodiments of FIGS. 4 and 5, the receiver 1 is modified in that the through apertures 18 in the upper mounting bar 8 are replaced by a further set of slots 40. The shoulders 30 and 32 of each module 12, 14 and 16 are modified in that each of the pins 26 and 28 are replaced by a protuberance 42. A protuberance 42 on upper shoulder 32 includes a spring loaded pin 44 which is biased out of the protuberance 42. The receiver is further modified to include a pin receiving aperture 46 at the base of slot 40. A plunger 48 is moveably retained in the pin receiving aperture 46. The module is inserted into the channels 23 and 25 as per the previous embodiment. However, in this embodiment the protuberances 42 are received in slots 40 and 20 when shoulders 30 and 32 enter channels 25 and 23. The pin 44 at the same time locates in pin receiving aperture 46 to affix the relative position of the module.

In order to release the module, plunger 48 is depressed in order to depress pin 44 against its spring mounting and thereby releasing pin 44 from its affixing in the pin receiving aperture 46. Lower shoulder 30 is then moved down into its lower channel 25, in order to move upper shoulder 32 out of its upper channel 23, allowing the module to be rotated from upper mounting bar 8 and lifted from lower channel 25.

The end 50 of shoulders 30 and 32 may be beveled to allow easier insertion into the channels 25 and 23 and to allow for a slight pivoting when rotating the module upon its mounting within its respective channels.

In a further embodiment (not shown in figures), pins 28 and/or 44 can be eliminated. Instead, the shoulders of the modules are merely provided with a hole (located in the same position where the pins reciprocate). A plunger, like plunger 48, can be biased so as to be inserted with the hole when it aligns with the plunger, to thereby lower the module with respect to the receiver. In this embodiment, the plunger is moveable in the aperture 46 and is longer than the aperture 46 that it can extend into and be received within the hole.

To release the module, the plunger is released from the plunger receiving aperture in order to release the protuberance from the upper mounting bar. Lower shoulder is then moved down into its lower channel, in order to move upper shoulder out of its upper channel, allowing the module to be rotated from upper mounting bar 8 and lifted from lower channel.

Figure 6:
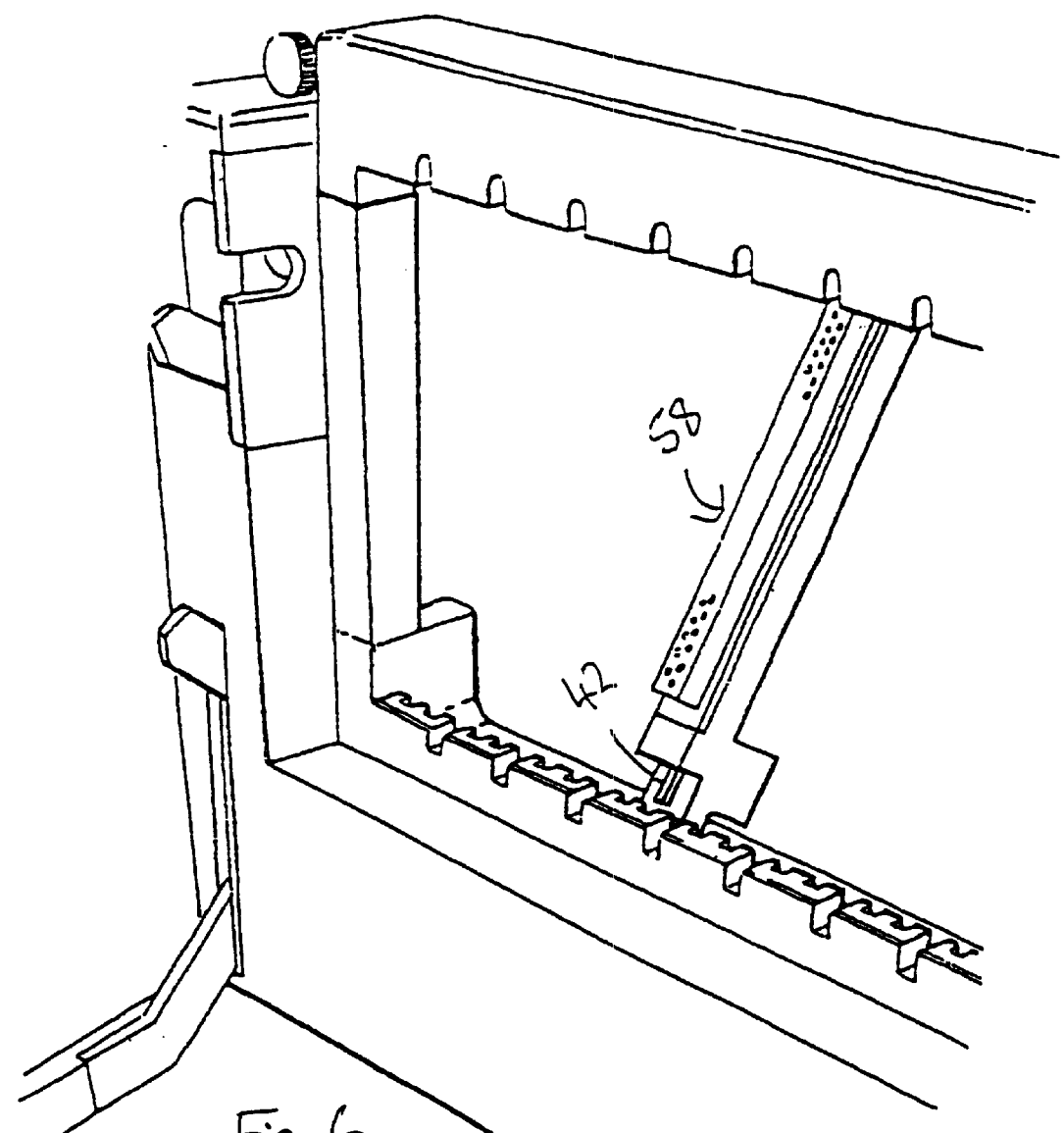
FIG. 6 is a partial front perspective view illustrating a receiver and a receiver connector module according to a third embodiment of the invention.
Figure 7:
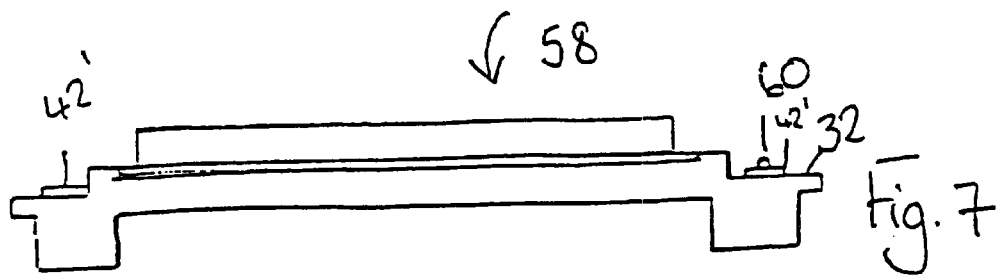
FIG. 7 is a side view of the receiver connector module of FIG. 6.
Figure 8:
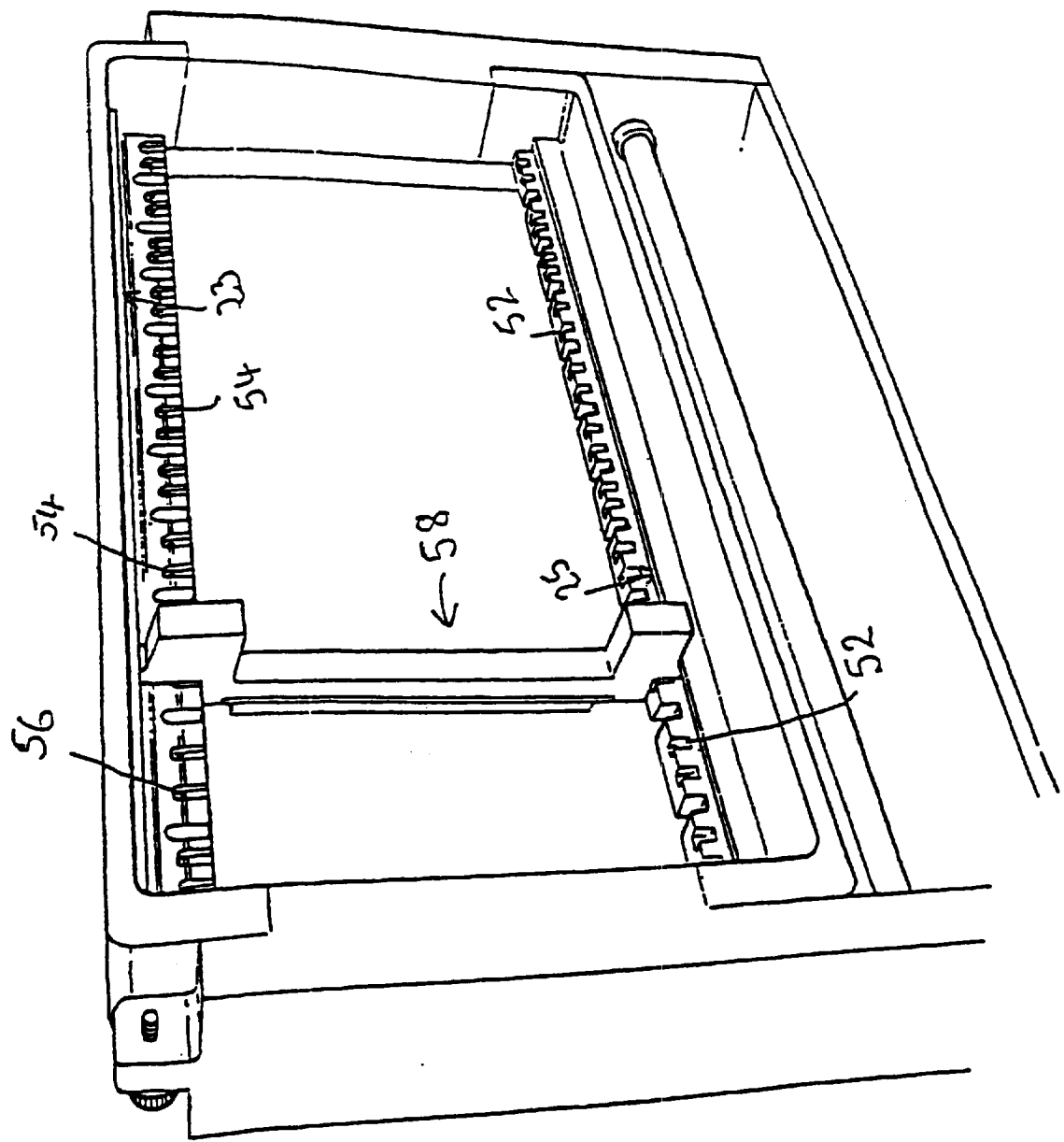
FIG. 8 is a rear perspective view of the receiver and receiver connector module shown in FIG. 6.

In the embodiment of FIGS. 6 to 8, the receiver has been further modified to include a pair of mounting grooves including a lower mounting groove 52 and an upper mounting groove 54 between each adjacent slot 20 and 40. Each upper mounting groove 54 on upper mounting bar 8 includes a dimple 56. The receiver is adapted to receive and retain receiver connector module 58 which has a smaller protuberance 42' on each of its shoulders 30 and 32 which are adapted to be received in mounting grooves 52 and 54, when the module is inserted into the channels 25 and 23. The protuberance 42' on upper shoulder 32 carries a ball bearing 60 which clicks into and is retained in dimple 54 when the protuberance 42' of the module is placed into the groove 54. The module 58 is removed by depressing the lower shoulder 30 into the lower channel 25, and thereby forcing the ball bearing 60 out of the dimple 54. This arrangement of the receiver also still receives the modules 12, 14 or 16. Therefore a variety of such modules may be affixed to the receiver. The module 58 is thinner than modules 12, 14 and 16 and therefore a greater number of these could be affixed to a single receiver.

Although the module 58 has been illustrated as a unitary unit, it could also be incorporated into the anodized aluminum reinforcement of the type used in module 14 and/or the adapter of module 12 and 16.

The receiver illustrated in FIGS. 6 to 8 still retains the slots 20 and 40 for receiving and affixing modules 12, 14 and 16. It is to be understood that the slots 40 may also be replaced by through apertures 18.

Figure 9:
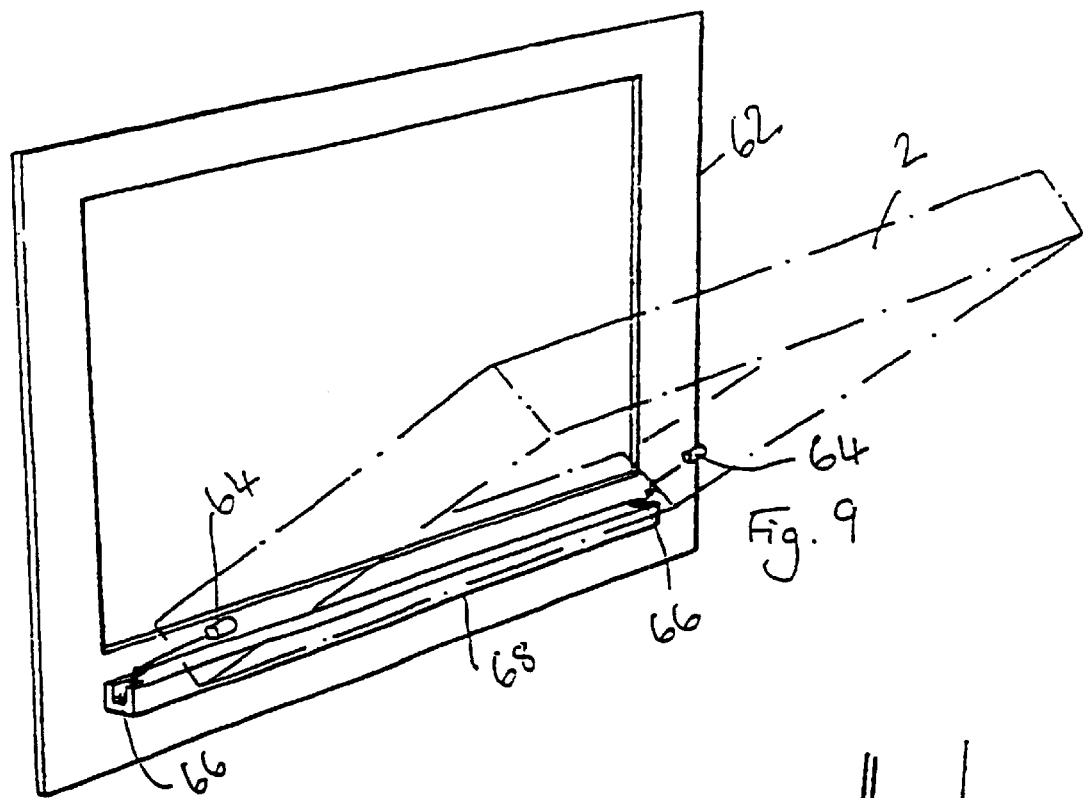
FIG. 9 is a perspective view of a receiver illustrating a hinged connection of a front panel to a back panel according to yet/still another embodiment of the invention.

Referring to FIG. 9 the top panel frame 2 of the receiver in use is mounted on a bottom panel frame 62 which is adapted to be connected to testing equipment such as a card cage containing testing cards. In this instance the bottom panel frame 62 is adapted to be bolted to the housing of the testing equipment. In order to allow access into such testing equipment and to permit removal of a receiver connector module with the adapter, the top panel can be rotated away from the bottom panel frame 62 to allow the required access. In accordance with the invention the top panel frame 2 is removable from the bottom panel frame 62 and for this purpose, the hinge mounting of top panel frame 2 on bottom panel frame 62 comprises two inwardly protruding pivots 64 which are releasably retained in the corresponding mounting sockets 66 on hinge bracket 68, which is affixed to the bottom panel frame 62.

The top panel frame 2 is removable from the bottom panel frame 62. This has the advantage that the receiver 1 can be separated into two section in order to allow easier transportation. Also, if the UUT is in a hard to reach location, it may be necessary to physically carry the testing equipment and the interface connector over the rough terrain. Additionally, the separation allows the top and bottom panel frames 2, 62 to allow the receiver 1 to be made larger such that it can be adapted to span two or more pieces of testing equipment at once. The increase in weight which would normally result from this arrangement being alleviated by the fact that it is possible to split the receiver into two separate section for transportation and/or handling when in-situ.

Figure 10:
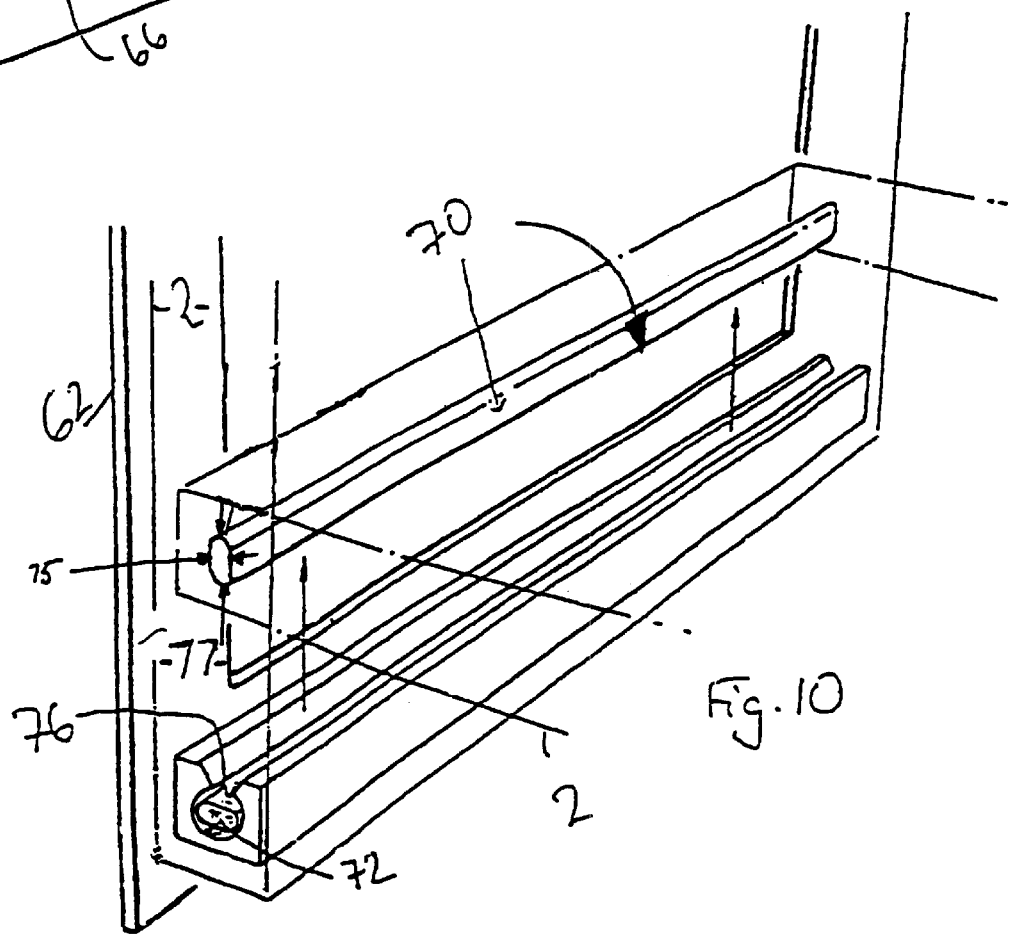
FIG. 10 is a perspective view of an alternative hinge arrangement.

In FIG. 10 a further embodiment of the hinge is illustrated in which the two separate pivots are replaced by a single pivot bar 70 which is releasably retained in mounting socket channel 72. Mounting socket channel 72 replaces the two separate mounting sockets 66 and runs the length of the panel 62. The pivot bar 70 has a cross-sectional profile that includes a major dimension 77 and a minor dimension 75. The mounting socket 72 has an opening set to accommodate the minor dimension 75 but not the major dimension 77 to enable mounting of the receiver 1 to one of the first and second frames. Therefore, the major dimension 77 prohibits the release of the receiver during testing of the unit under test. In these two embodiments of the hinge, the function of the hinge is the same and operates as follows:

The pivots 64, 70 have a substantially oval cross-section, while the base of the sockets 66, 72 have a complementary oval configuration. As best illustrated in FIG. 10 when the top panel frame 2 rests on the bottom panel frame 62, the configuration in which it is normally used, the oval configurations of the sockets 66, 72 and the pivots 64, 70 are aligned and the sockets 66, 72 cannot pass through socket opening 74, since the major dimension 77 is larger than the socket opening 74. Thereby the top panel frame 2 is retained on the bottom panel frame 62. However when the top panel frame 2 is rotated away from the bottom panel frame 62, the oval shaped socket 64, 70 rotates within the sockets 66, 72 such that the minor dimension 75 of the oval socket 64, 70 can pass through the opening 74 allowing the top panel frame 2 to be lifted from the bottom panel 62, and thereby separated.

Although the receiver has been described as comprising top and bottom releasably hinged panels, the bottom panel may be omitted.

Further, in both of the embodiments shown in FIGS. 9 and 10, the modules 12, 14, 16 can pivot along with the receiver as it moves between the open and closed positions. Moreover, the optional adapter 36, if it is also connected to the module 12, can also pivot along with the module 12 and the receiver 1 when the receiver 1 pivots between the open and closed positions. The adapter 36 need not be fixedly attached to the test card within the testing unit.

While the invention has been described with reference to the certain illustrated embodiments, the words that have been used herein are words of description, rather than words of limitation. Changes may be made, within the purview of the appended claims, without departing from the scope and spirit of the invention in its aspects, and various other modifications of the invention may occur to those skilled in the art. Although the invention has been described herein with reference to particular structures, acts, and materials, the invention is not to be limited to the particulars disclosed, but rather extends to all equivalent structures, acts, and materials.

What is claimed is:

1. A connection interface system for providing an interface between a unit under test and testing equipment, the system comprising:
   a receiver including a first frame associated with the testing equipment;
   a second frame associated with the unit under test;
   the receiver including an upper mounting bar associated with an upper mounting rail to define an upper channel and a lower mounting bar associated with a lower mounting rail to define a lower channel;
   at least one receiver connector module releasably mounted on the receiver to be aligned with the first frame, the receiver connector module including an upper shoulder mounted within the upper channel, a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel; and
   one of the upper and lower mounting bars including at least one slot that cooperates with one of the upper and lower positioning members, and another of the upper and lower mounting bars including at least one aperture that cooperates with the other of the upper and lower positioning members, each said at least one slot including an open side facing a corresponding said at least one aperture.

2. The system of claim 1, wherein at least one of the upper and lower positioning members comprises a retractable pin received in the at least one aperture.

3. The system of claim 1, wherein said at least one slot includes a plurality of slots and at least one mounting groove is positioned between adjacent slots.

4. The system of claim 3, wherein each of the upper and lower positioning members includes a protuberance, at least one of the protuberances having a bearing and said at least one mounting groove has a dimple for receipt of the bearing.

5. The system of claim 1, wherein each of the upper and lower mounting bars includes at least one slot that cooperates with the upper and lower positioning members, respectively, and at least one of the protuberances includes a retractable pin.

6. The system of claim 5, further comprising a plunger structured to release the retractable pin from the receiver.

7. The system of claim 1, further comprising a hinge bracket on the first frame, the receiver being releasably retained on the hinge bracket.

8. The system of claim 7, wherein the receiver includes two inward protruding pivots that are releasably retained to corresponding mounting sockets on opposite sides of the hinge bracket.

9. The system of claim 8, wherein each of the two inward protruding pivots has an oval cross section and each of the mounting sockets has an oval cross section that is complimentary to the oval cross section of the two inward protruding pivots.

10. The system of claim 7, wherein the receiver includes a pivot bar that is releasably retained to a mounting socket channel on the hinge bracket.

11. The system of claim 10, wherein the pivot bar has a cross-sectional profile including a major dimension and a minor dimension and the mounting socket has an opening set to accommodate the minor dimension but not the major dimension whereby the major dimension of the pivot bar prohibits release of the receiver during testing of the unit under test.

12. A receiver comprising:
   an upper mounting bar associated with an upper mounting rail to define an upper channel;
   a lower mounting bar associated with a lower mounting rail to define a lower channel;
   at least one receiver connector module including an upper shoulder mounted within the upper channel and a lower shoulder mounted within the lower channel, an upper positioning member coupled with the upper shoulder that positions the upper shoulder relative to the upper channel and a lower positioning member coupled with the lower shoulder that positions the lower shoulder relative to the lower channel; and
   one of the upper and lower mounting bars including at least one slot that cooperates with one of the upper and lower positioning members, and another of the upper and lower mounting bars including at least one aperture that cooperates with the other of the upper and lower positioning members, each said at least one slot including an open side facing a corresponding said at least one aperture.

13. The receiver of claim 12, wherein at least one of the upper and lower positioning members comprises a retractable pin received in the at least one aperture.

14. The receiver of claim 12, wherein said at least one slot includes a plurality of slots and at least one mounting groove is positioned between adjacent slots.

15. The receiver of claim 14, wherein each of the upper and lower positioning members includes a protuberance, at least one of the protuberances having a bearing and said at least one mounting groove has a dimple for receipt of the bearing.

16. The receiver of claim 14, wherein at least one of the protuberances includes a retractable pin.

17. The receiver of claim 16, further comprising a plunger structured to release the retractable pin from the receiver.

18. A receiver connector module for use in a connection interface system having a receiver, the receiver connector module comprising:
   an upper shoulder mountable within an upper channel of the receiver and a lower shoulder mountable within a lower channel of the receiver; and
   an upper positioning member coupled to the upper shoulder and structured to position the upper shoulder relative to the upper channel and a lower positioning member coupled to the lower shoulder and structured to position the lower shoulder relative to the lower channel, at least one of the upper and lower positioning members comprising a retractable pin.

19. The receiver of claim 18, wherein the upper and lower positioning members are protuberances mounted on the upper and lower shoulders, respectively, and at least one of the protuberances includes a retractable pin.

20. The receiver of claim 18, wherein the upper and lower positioning members are protuberances mounted on the upper and lower shoulders, respectively, and at least one of the protuberances comprises a plunger receiving aperture.

* * * * *

UNITED STATES PATENT AND TRADEMARK OFFICE
CERTIFICATE OF CORRECTION

PATENT NO.     : 6,547,587 B2
DATED          : July 18, 2003
INVENTOR(S)    : Roy Hurst et al.

It is certified that error appears in the above-identified patent and that said Letters Patent is hereby corrected as shown below:

<u>Title page,</u>
Item [30], Foreign Application Priority Data, "010760" should read -- 0107460.8 --.

Signed and Sealed this

Fourteenth Day of October, 2003

JAMES E. ROGAN
*Director of the United States Patent and Trademark Office*